US009899795B2

United States Patent
Murai et al.

(10) Patent No.: US 9,899,795 B2
(45) Date of Patent: Feb. 20, 2018

(54) SEMICONDUCTOR LASER LIGHT SOURCE DEVICE, SEMICONDUCTOR LASER LIGHT SOURCE SYSTEM, AND IMAGE DISPLAY APPARATUS

(71) Applicant: Mitsubishi Electric Corporation, Tokyo (JP)

(72) Inventors: Hideyuki Murai, Tokyo (JP); Tatsuro Hirose, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/527,219

(22) PCT Filed: Nov. 27, 2015

(86) PCT No.: PCT/JP2015/083458
§ 371 (c)(1),
(2) Date: May 16, 2017

(87) PCT Pub. No.: WO2016/132622
PCT Pub. Date: Aug. 25, 2016

(65) Prior Publication Data
US 2017/0353003 A1 Dec. 7, 2017

(30) Foreign Application Priority Data
Feb. 16, 2015 (JP) .................. 2015-027218

(51) Int. Cl.
H01S 5/02 (2006.01)
H01S 5/024 (2006.01)
H01S 5/026 (2006.01)
H01S 5/022 (2006.01)
H01S 5/00 (2006.01)

(52) U.S. Cl.
CPC .............. H01S 5/024 (2013.01); H01S 5/005 (2013.01); H01S 5/022 (2013.01); H01S 5/0261 (2013.01); H01S 5/02407 (2013.01); H01S 5/02423 (2013.01)

(58) Field of Classification Search
None
See application file for complete search history.

(56) References Cited

U.S. PATENT DOCUMENTS

| 5,900,967 A | 5/1999 | Zamel |
| 8,096,348 B2 | 1/2012 | Takagi et al. |
| 9,083,143 B2 | 7/2015 | Okumura |

FOREIGN PATENT DOCUMENTS

| JP | 2001-326411 A | 11/2001 |
| JP | 2003-188456 A | 7/2003 |
| JP | 2005-50844 A | 2/2005 |

(Continued)

Primary Examiner — Armando Rodriguez
(74) Attorney, Agent, or Firm — Birch, Stewart, Kolasch & Birch, LLP

(57) ABSTRACT

The object is to provide a technique that allows a semiconductor laser to be efficiently cooled. A semiconductor laser light source device includes: a semiconductor laser; a cooler that cools the semiconductor laser; and a driving substrate that drives the semiconductor laser. The cooler is placed in contact with a surface of the semiconductor laser that is opposite to a light emitting surface of the semiconductor laser. Furthermore, the driving substrate is placed in contact with a surface of the cooler that is opposite to a surface of the cooler on which the semiconductor laser is placed.

9 Claims, 12 Drawing Sheets

(56) References Cited

FOREIGN PATENT DOCUMENTS

| | | |
|---|---|---|
| JP | 2007-127398 A | 5/2007 |
| JP | 2009-99633 A | 5/2009 |
| JP | 2011-76781 A | 5/2009 |
| JP | 2013-149667 A | 8/2013 |
| WO | WO 2012/093637 A1 | 7/2012 |

F I G. 3 A
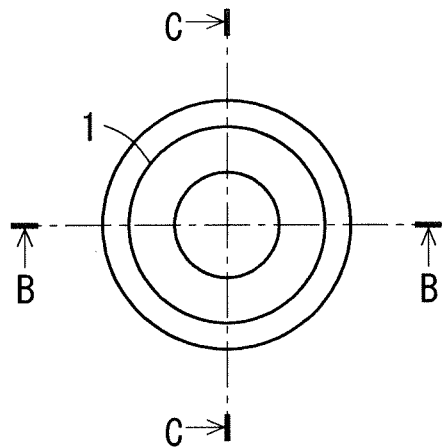
F I G. 3 B
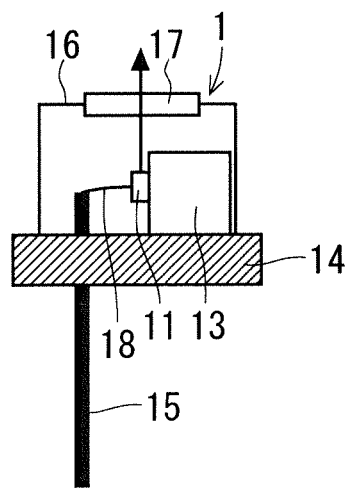
F I G. 3 C
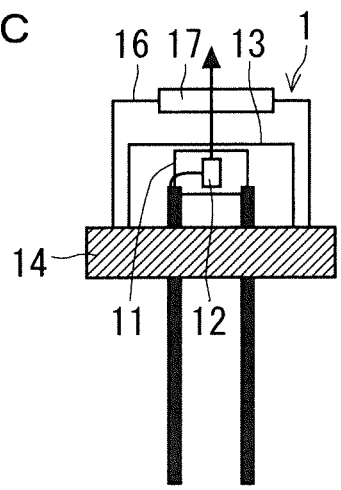

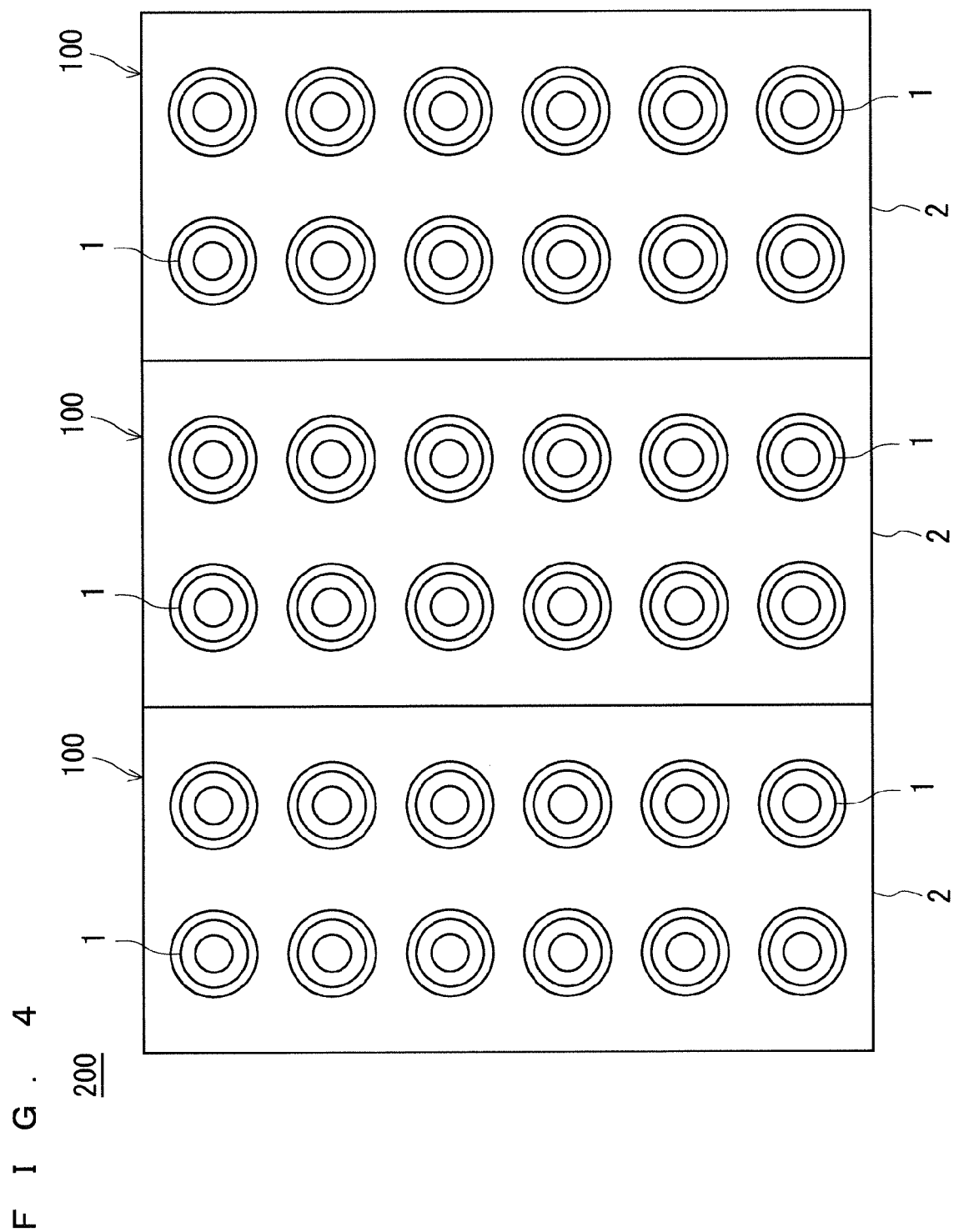

F I G. 6 A
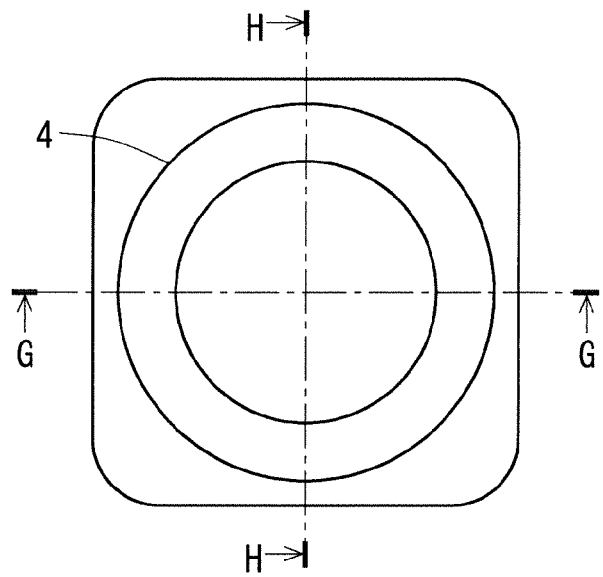
F I G. 6 B
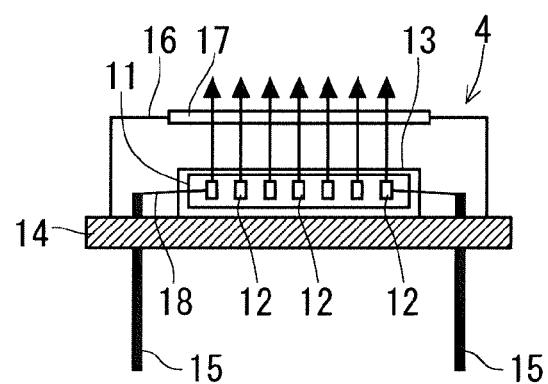
F I G. 6 C
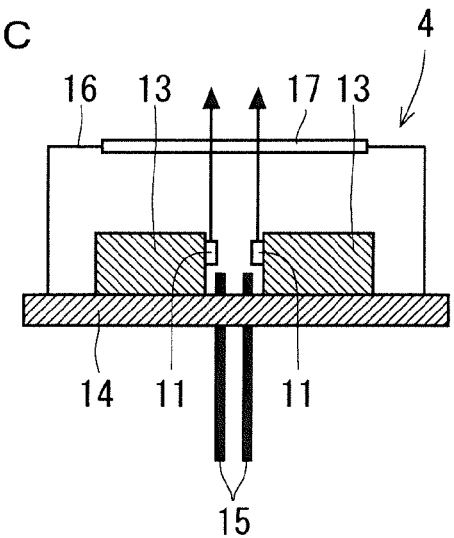

SEMICONDUCTOR LASER LIGHT SOURCE DEVICE, SEMICONDUCTOR LASER LIGHT SOURCE SYSTEM, AND IMAGE DISPLAY APPARATUS

TECHNICAL FIELD

The present invention relates to a semiconductor laser light source device and a semiconductor laser light source system each including a cooler that cools a semiconductor laser, and to an image display apparatus including the semiconductor laser light source device or the semiconductor laser light source system.

BACKGROUND ART

In recent years, solid-state light sources such as LEDs or semiconductor lasers have been widely commercially available or suggested as light sources for large high-brightness projectors intended for large halls or digital cinemas, for small to medium sized projectors intended mainly for a small number conference or presentation, and for projection monitors including, in its casing, a projection optical system and a large screen. In these devices, the conventional lamps used as the light sources for many projectors and projection monitors are replaced by the solid-state light sources. Accordingly, these devices have advantages of, for example, wider color gamut, instant light capability, low power consumption, and long life.

Particularly, the semiconductor lasers have additional advantages of higher brightness and higher output through superposition of light. Thus, high-output semiconductor laser light source devices using a larger number of semiconductor lasers are being developed for use in large high-brightness projectors that project large screens.

However, the semiconductor lasers are more heat-sensitive than the other solid-state light sources such as LEDs, and the electrical-to-optical efficiency thereof is prone to extremely decrease according to increase in temperature of the elements. Furthermore, the continued emission of high-output light at high temperatures expedites degradation of the elements and tends to shorten the life thereof. Thus, the semiconductor lasers require a heat dissipation structure with cooling capability higher than those of the other solid-state light sources to obtain a desired amount of light even when the ambient temperature is high.

For example, Patent Document 1 discloses a structure including rectangular tine shaped radiating fins placed on a base equipped with a semiconductor laser, and a cooling fan fixed to the radiating fins with a driving substrate having holes interposed therebetween.

Furthermore, Patent Document 2 discloses a structure in which a flexible substrate for electrically connecting semiconductor lasers is embedded in a heat transfer component or in a base of a heat sink to dissipate heat from the semiconductor lasers.

PRIOR-ART DOCUMENTS

Patent Documents

Patent Document 1: Japanese Patent Application Laid-Open No. 2001-326411
Patent Document 2: Japanese Patent Application Laid-Open No. 2011-76781

SUMMARY OF INVENTION

Problems to be Solved by the Invention

In the structure disclosed by Patent Document 1, the radiating fins formed to cool the semiconductor lasers are cooled by the cooling fan through the driving substrate having the holes. Since the driving substrate blocks winds blown by the cooling fan, there have been problems with inefficient cooling of the radiating fins, decrease in the cooling capability, and inefficient cooling of the semiconductor lasers.

In the structure disclosed by Patent Document 2, when the flexible substrate that electrically connects the semiconductor laser and the heat sink is placed therebetween, the contact area between the heat sink and the semiconductor laser that is a heat generating source is reduced. Accordingly, increase in thermal resistance reduces the cooling capability, thus posing a problem with inefficient cooling of the semiconductor laser.

To this end, the present invention has an object of providing a technique that allows a semiconductor laser to be efficiently cooled.

Means to Solve the Problems

A semiconductor laser light source device according to the present invention includes: a semiconductor laser; a cooler that cools the semiconductor laser; and a driving substrate that drives the semiconductor laser, wherein the cooler is placed in contact with a surface of the semiconductor laser, the surface being opposite to a light emitting surface of the semiconductor laser, the driving substrate is placed in contact with a surface of the cooler, the surface being opposite to a surface of the cooler on which the semiconductor laser is placed, and the cooler includes a hollow in which a plurality of fins are arranged.

A semiconductor laser light source device according to the present invention includes: a semiconductor laser; a cooler that cools the semiconductor laser; and a driving substrate that drives the semiconductor laser, wherein each of the cooler and the driving substrate is placed in contact with a surface of the semiconductor laser, the surface being opposite to a light emitting surface of the semiconductor laser, the cooler is formed in a protruding shape so that a center of the cooler in a width direction is higher than ends of the cooler, or is formed in a depressed shape so that the center of the cooler in the width direction is lower than the ends of the cooler, and a plurality of fins are arranged on a lower surface of the cooler.

A semiconductor laser light source system according to the present invention includes a plurality of the semiconductor laser light source devices.

An image display apparatus according to the present invention includes the semiconductor laser light source device or the semiconductor laser light source system.

Effects of the Invention

According to the present invention, since a semiconductor laser and a cooler are in direct contact with each other, the thermal resistance between the semiconductor laser and the cooler can be reduced, and the semiconductor laser can be efficiently cooled.

The objects, features, aspects and advantages of the present invention will become more apparent from the following detailed description and the accompanying drawings of the present invention.

BRIEF DESCRIPTION OF DRAWINGS

FIGS. 3A to 3C illustrate a structure of a semiconductor laser according to Embodiment 1.

FIG. 4 illustrates an outline structure of a semiconductor laser light source system according to Embodiment 1.

FIGS. 6A to 6C illustrate a structure of a semiconductor element according to Embodiment 2.

DESCRIPTION OF EMBODIMENTS

Embodiment 1

Figure 1:
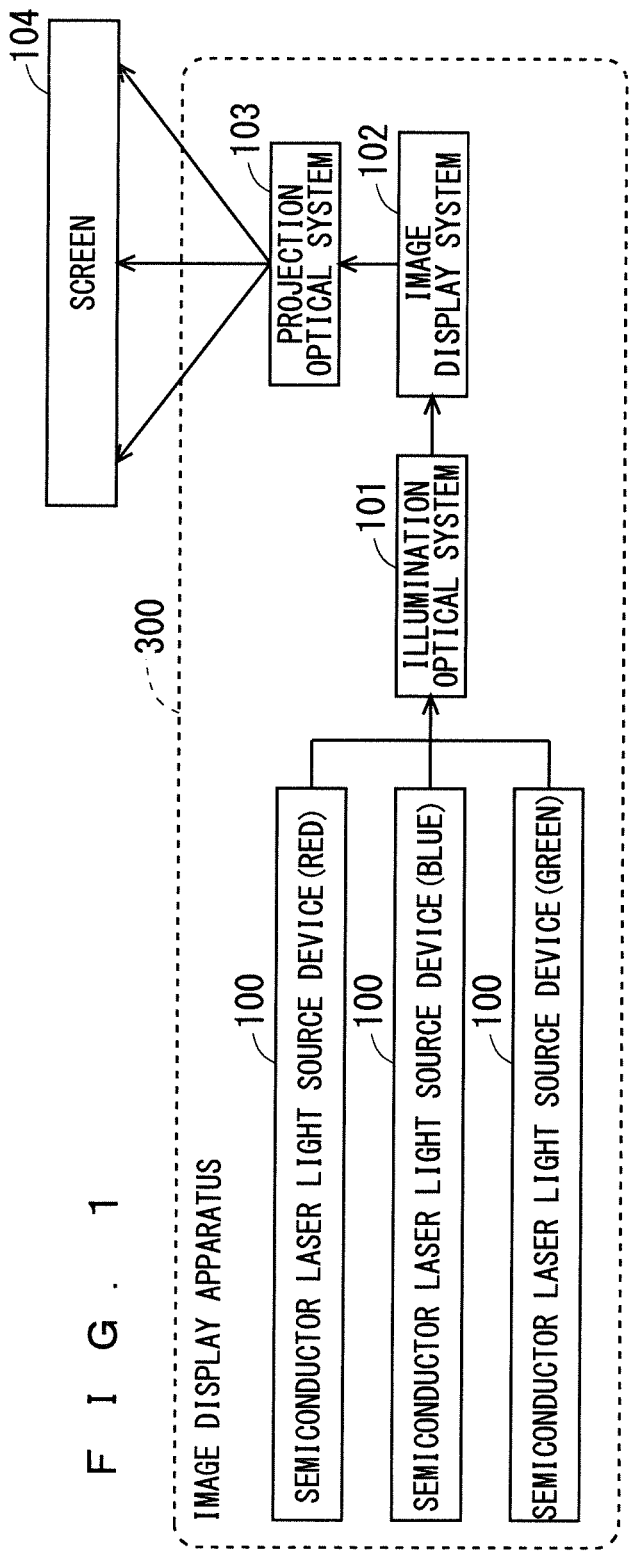
FIG. 1 illustrates a structure of an image display apparatus including semiconductor laser light source devices according to Embodiment 1.

Embodiment 1 according to the present invention will be hereinafter described with reference to the drawings. Semiconductor laser light source devices 100, a semiconductor laser light source system 200, and an image display apparatus 300 according to Embodiment 1 will be described in detail. First, the image display apparatus 300 will be described. FIG. 1 illustrates a structure of the image display apparatus 300 according to Embodiment 1.

The image display apparatus 300 includes the semiconductor laser light source devices 100 of three types that are red, blue, and green, an illumination optical system 101, an image display system 102, and a projection optical system 103. The semiconductor laser light source devices 100 are high-output semiconductor laser light source devices each including semiconductor lasers.

The illumination optical system 101 combines and converts the red, blue, and green lights emitted by the semiconductor laser light source devices 100 into white light, and emits the white light to the image display system 102. For example, digital light processing (DLP) or liquid crystal on silicon (LCOS) can be used as the image display system 102.

The image produced by the image display system 102 is enlarged by the projection optical system 103, and displayed on a screen 104.

Although the image display apparatus 300 in FIG. 1 is intended to represent a projector that displays white light by combination with the semiconductor laser light source devices 100 of three types that are red, blue, and green, it may be an image display apparatus that displays white light by combination with a semiconductor laser and a phosphor or by combination with a semiconductor laser and an LED.

Figure 2A:
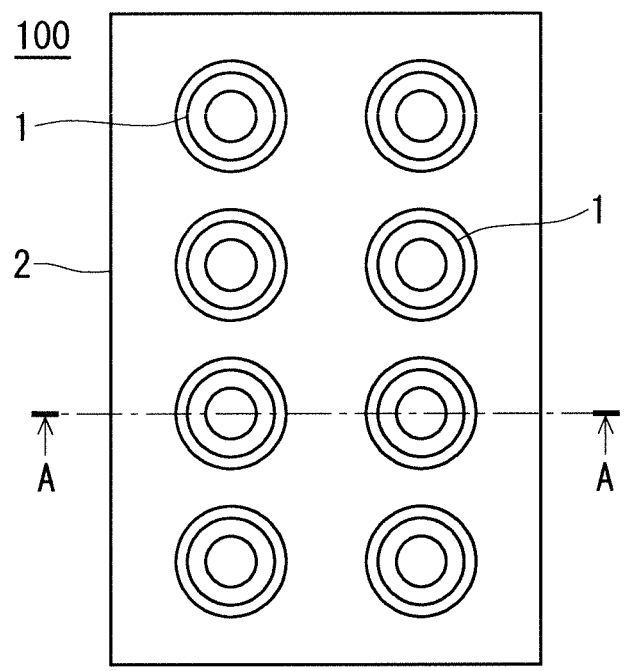
FIGS. 2A to 2C illustrate an outline structure of the semiconductor laser light source device according to Embodiment 1.
Figure 2B:
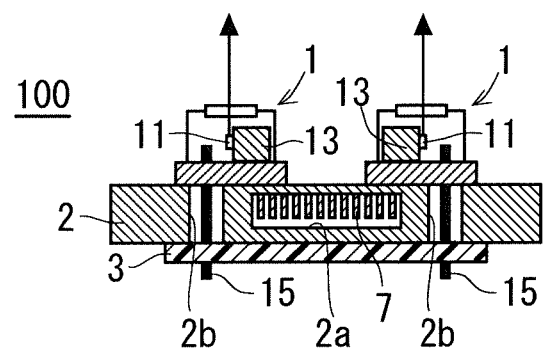
Figure 2C:
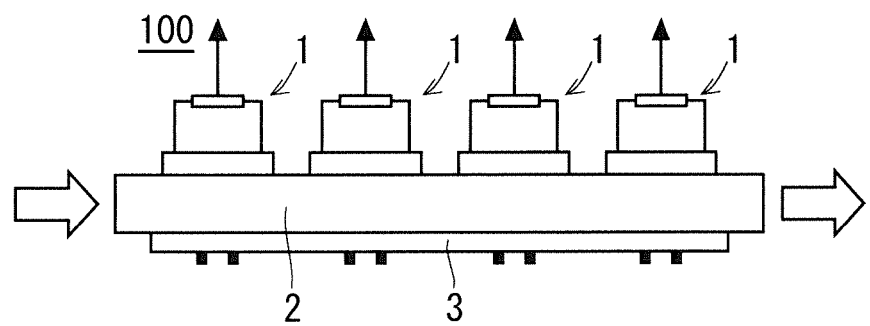

Next, the semiconductor laser light source device 100 according to Embodiment 1 will be described. FIGS. 2A to 2C illustrate an outline structure of the semiconductor laser light source device 100. Specifically, FIG. 2A is a plan view of the semiconductor laser light source device 100, FIG. 2B is a cross-sectional view taken along A-A of FIG. 2A, and FIG. 2C is a side view of the semiconductor laser light source device 100. FIGS. 3A to 3C illustrate a structure of a semiconductor laser 1. Specifically, FIG. 3A is a plan view of the semiconductor laser 1, FIG. 3B is a cross-sectional view taken along the line B-B of FIG. 3A, and FIG. 3C is a cross-sectional view taken along the line C-C of FIG. 3A.

As illustrated in FIGS. 2A to 2C, the semiconductor laser light source device 100 includes the (for example, eight) semiconductor lasers 1, a cooler 2, and a driving substrate 3. First, the semiconductor laser 1 will be described.

As illustrated in FIGS. 3A to 3C, the semiconductor laser 1 includes a chip 11, a light emitting layer 12, a heat dissipation block 13, a plate 14, terminal pins 15, a package 16, and a glass window 17. The light emitting layer 12 is a layer that emits light, and is formed in the chip 11. Since the chip 11 generates heat, it is placed on the side surface of the heat dissipation block 13 and above the plate 14, and dissipates heat into the heat dissipation block 13. The terminal pins 15 are components that are supplied with power from outside and bring the chip 11 into conduction to allow the chip 11 to emit light. The terminal pins 15 are connected to the chip 11 through a wire 18. Since the performance of the chip 11 is degraded by influence of, for example, dust, the chip 11 is sealed by the package 16 while it is placed above the plate 14 through the heat dissipation block 13. Accordingly, the influence of, for example, dust is eliminated. The glass window 17 is placed on the upper surface of the package 16, and transmits the light emitted from the light emitting layer 12. The emitted light is illustrated by arrows in FIGS. 3A to 3C. The same holds true for the other drawings.

As illustrated in FIGS. 2A to 2C, the cooler 2 is a component for cooling the semiconductor lasers 1. The semiconductor lasers 1 are arranged in two lines on the upper surface of the cooler 2 so that the heat dissipation blocks 13 on each of which the chip 11 is placed are facing to each other. The cooler 2 is placed in contact with the lower surfaces of the semiconductor lasers 1 (surfaces of the semiconductor lasers 1 that are opposite to light emitting surfaces thereof), and is placed directly below the heat dissipation blocks 13. The driving substrate 3 is a substrate equipped with a driving circuit for driving the semiconductor lasers 1. The driving substrate 3 is placed in contact with the lower surface of the cooler 2 (surface opposite to a surface on which the semiconductor lasers 1 are arranged).

The cooler 2 includes a hollow 2a in which fins 7 are arranged, and through holes 2b into which the terminal pins 15 are inserted. The hollow 2a is formed at the center of the cooler 2 in its width direction along the longitudinal direction and placed below the heat dissipation blocks 13, and the fins 7 are arranged below the heat dissipation blocks 13. The cooler 2 functions as a liquid cooling device, by causing, for example, water to flow through the cooler 2 using the fins 7 as a channel. The channel is illustrated by open arrows in FIGS. 2A to 2C. The same holds true for the other drawings.

The through holes 2b are formed in respective positions of the terminal pins 15 of the semiconductor lasers 1. Although not illustrated, through holes into which the terminal pins 15 are inserted are also formed in the driving substrate 3.

Next, the semiconductor laser light source system 200 will be described. FIG. 4 illustrates an outline structure of the semiconductor laser light source system 200. As illustrated in FIG. 4, the semiconductor laser light source system 200 includes the (for example, three) semiconductor laser light source devices 100 horizontally arranged. Although FIG. 4 illustrates the structure in which each of the semiconductor laser light source devices 100 includes the cooler 2, the semiconductor lasers 1 of the three semiconductor laser light source devices 100 may be placed on the one cooler 2. Furthermore, although the image display apparatus 300 in FIG. 1 includes the three semiconductor laser light source devices 100, it may include the three semiconductor laser light source systems 200 instead.

As described above, in the semiconductor laser light source device 100 according to Embodiment 1, the cooler 2 is placed in contact with the surfaces of the semiconductor lasers 1 that are opposite to the light emitting surfaces thereof, and the driving substrate 3 is placed in contact with the surface of the cooler 2 that is opposite to the surface on which the semiconductor lasers 1 are arranged.

Since the semiconductor lasers 1 and the cooler 2 are in direct contact with each other, the thermal resistance between the semiconductor lasers 1 and the cooler 2 can be reduced, and the semiconductor lasers 1 can be efficiently cooled. With efficient cooling of the semiconductor lasers 1, not only the semiconductor lasers 1 but also the semiconductor laser light source devices 100 can be used for a longer period of time.

Furthermore, since the semiconductor laser light source system 200 includes the semiconductor laser light source devices 100, it can produce higher output than that by the semiconductor laser light source device 100 alone.

Furthermore, since the image display apparatus 300 includes the semiconductor laser light source devices 100, it can efficiently cool the semiconductor lasers 1. Alternatively, when the image display apparatus 300 includes the semiconductor laser light source system 200, besides the advantage above, it can produce an advantage of higher output than that when it includes the semiconductor laser light source devices 100.

Embodiment 2

Figure 5A:
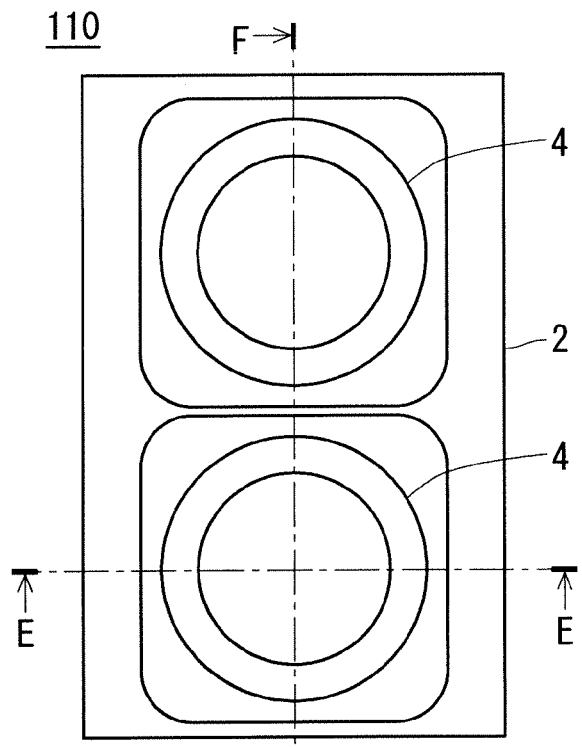
FIGS. 5A to 5C illustrate an outline structure of a semiconductor laser light source device according to Embodiment 2.
Figure 5B:
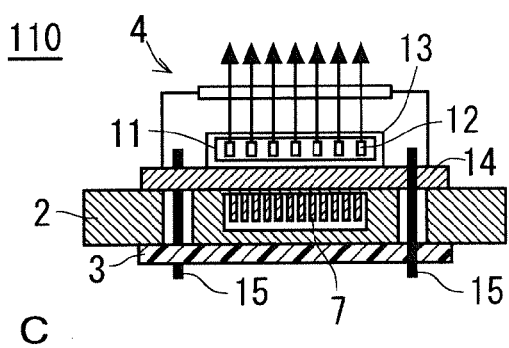
Figure 5C:
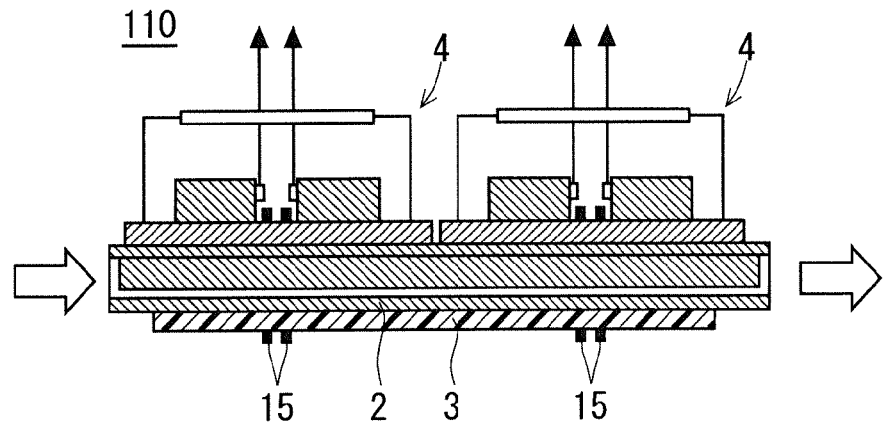

Next, a semiconductor laser light source device 110 according to Embodiment 2 will be described. FIGS. 5A to 5C illustrate an outline structure of the semiconductor laser light source device 110 according to Embodiment 2. Specifically, FIG. 5A is a plan view of the semiconductor laser light source device 110, FIG. 5B is a cross-sectional view taken along E-E of FIG. 5A, and FIG. 5C is a cross-sectional view taken along F-F of the semiconductor laser light source device 110. FIGS. 6A to 6C illustrate a structure of a semiconductor element 4. Specifically, FIG. 6A is a plan view of the semiconductor element 4, FIG. 6B is a cross-sectional view taken along G-G of FIG. 6A, and FIG. 6C is a cross-sectional view taken along H-H of FIG. 6A. The same reference numerals as those according to Embodiment 1 will be assigned to the same constituent elements and the description thereof will be omitted in Embodiment 2.

As illustrated in FIGS. 5A to 5C, the semiconductor laser light source device 110 includes the semiconductor elements 4, the cooler 2, and the driving substrate 3. As illustrated in FIGS. 6A to 6C, the semiconductor element 4 is a large semiconductor element in which the (for example, two) chips 11 are placed on the respective heat dissipation blocks 13. The semiconductor element 4 includes the (for example, two) chips 11, the (for example, fourteen) light emitting layers 12, the (for example, two) heat dissipation blocks 13, the plate 14, the terminal pins 15, the package 16, and the glass window 17. The semiconductor elements 4 are arranged on the upper surface of the cooler 2, and the two heat dissipation blocks 13 in each of the semiconductor elements 4 are arranged to face to each other.

The seven light emitting layers 12 are arranged per the chip 11. The two heat dissipation blocks 13 in each of the semiconductor elements 4 are arranged so that the seven light emitting layers 12 arranged in one of the two heat dissipation blocks 13 face to the seven light emitting layers 12 arranged in the other of the heat dissipation blocks 13. The arrangement direction of the light emitting layers 12 is parallel to the width direction of the cooler 2. Furthermore, the arrangement direction of the two semiconductor elements 4 is vertical to the arrangement direction of the light emitting layers 12. Thus, the channel of the fins 7 is parallel to the longitudinal direction of the cooler 2, that is, the arrangement direction of the two semiconductor elements 4.

Since the chips 11 of each of the semiconductor elements 4 include the light emitting layers 12, they are larger than those of the semiconductor lasers 1 according to Embodiment 1. Furthermore, the heat dissipation blocks 13 for cooling the chips 11 and the plates 14 are similarly larger. The cooler 2 is placed directly below the heat dissipation blocks 13 to be in contact with the semiconductor elements 4.

The terminal pins 15 are arranged outside of the heat dissipation blocks 13. As a result, the two heat dissipation blocks 13 can be closely placed. Furthermore, with the terminal pins 15 placed outside of the heat dissipation blocks 13, the cooler 2 can be placed directly below the heat dissipation blocks 13 to be in contact with the semiconductor elements 4 similarly as in the Embodiment 1. As a result, since the thermal resistance between the heat dissipation blocks 13 and the cooler 2 can be reduced, the semiconductor elements 4 can be efficiently cooled.

Furthermore, since the number of the terminal pins 15 in the semiconductor laser light source device 110 can be reduced more than that of the semiconductor laser 1 according to Embodiment 1 by including the semiconductor elements 4 in each of which the chips 11 including the light emitting layers 12 are placed, a heat dissipation area of the semiconductor laser light source device 110 can be relatively increased. Accordingly, the semiconductor elements 4 can be efficiently cooled.

Figure 7A:
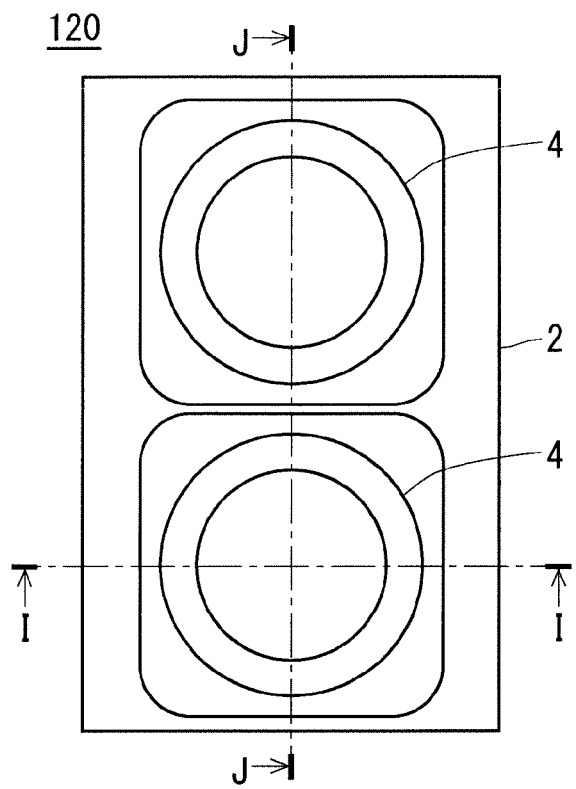
FIGS. 7A to 7C illustrate another outline structure of the semiconductor laser light source device according to Embodiment 2.
Figure 7B:
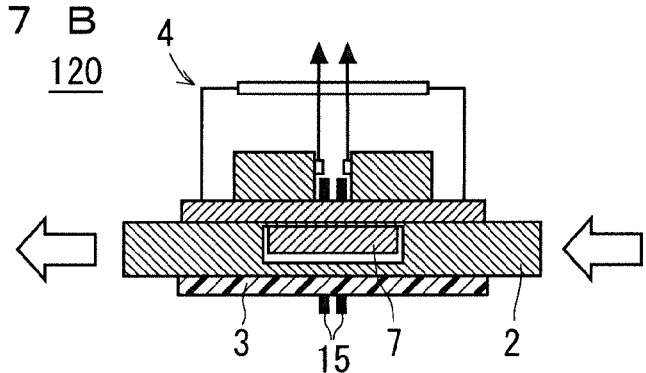
Figure 7C:
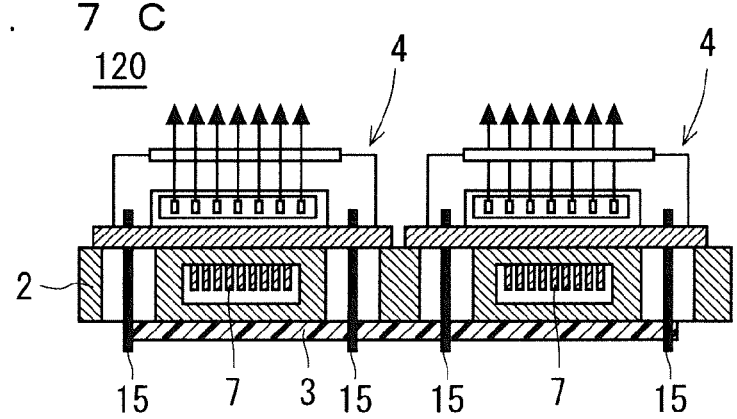

Next, another structure according to Embodiment 2 will be described. FIGS. 7A to 7C illustrate another outline structure of the semiconductor laser light source device according to Embodiment 2. Specifically, FIG. 7A is a plan view of a semiconductor laser light source device 120, FIG. 7B is a cross-sectional view taken along the line I-I of FIG. 7A, and FIG. 7C is a cross-sectional view taken along the line J-J of FIG. 7A.

The arrangement direction of the two semiconductor elements 4 is vertical to the arrangement direction of the light emitting layers 12 in the structure of FIGS. 5A to 5C.

As a result, one channel can be formed per the semiconductor element 4. In contrast, the arrangement direction of the two semiconductor elements 4 is parallel to the arrangement direction of the light emitting layers 12 in the structure of FIGS. 7A to 7C. In other words, the semiconductor elements 4 are arranged so that the arrangement direction of the seven light emitting layers 12 is parallel to the longitudinal direction of the cooler 2. Thus, since the channel of the fins 7 is formed in parallel with the width direction of the cooler 2 and does not pass through the semiconductor elements 4, an advantage that each temperature of the semiconductor elements 4 can be controlled is obtained.

Figure 8:
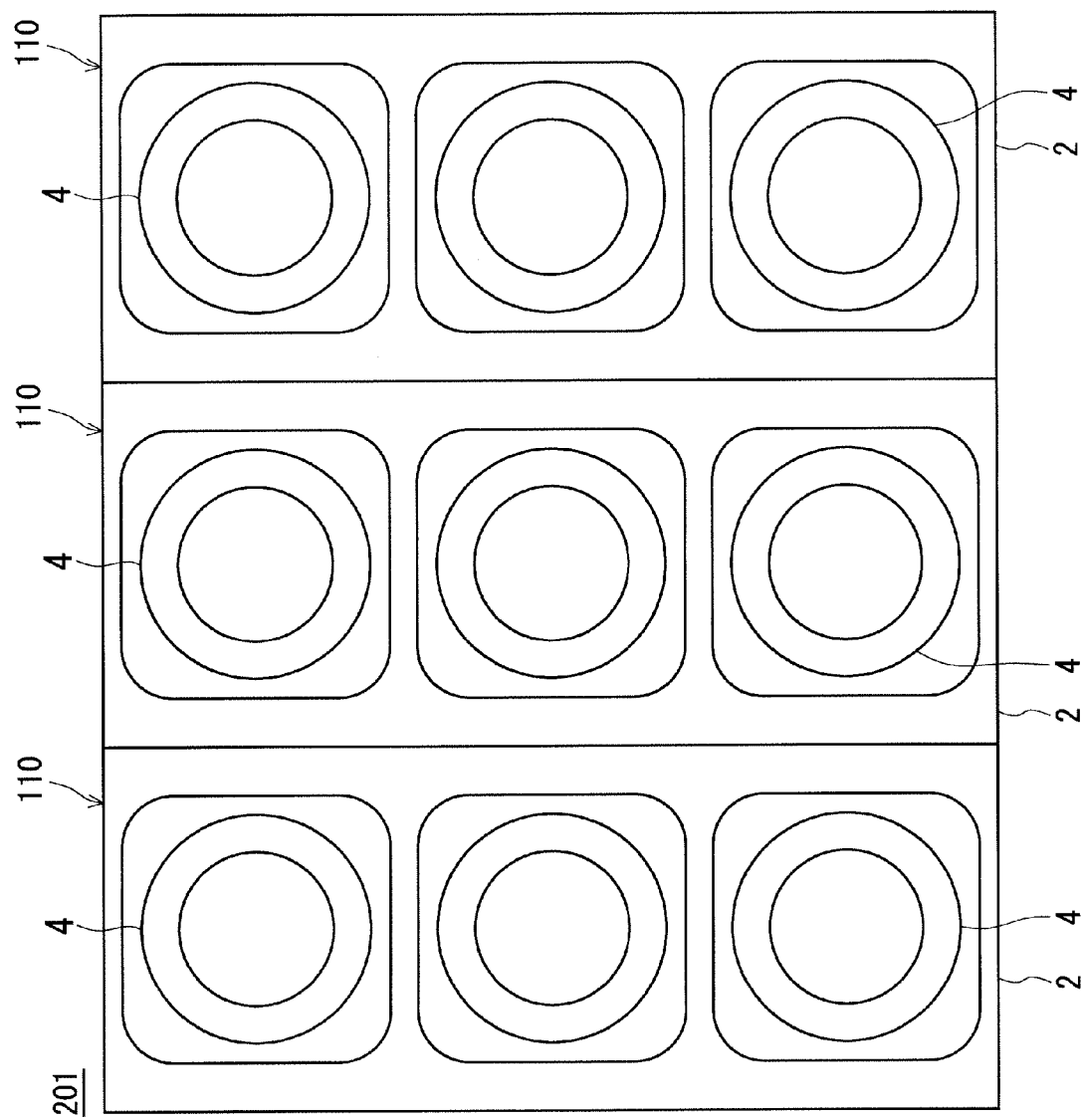
FIG. 8 illustrates an outline structure of a semiconductor laser light source system according to Embodiment 2.

Next, a semiconductor laser light source system 201 according to Embodiment 2 will be described. FIG. 8 illustrates an outline structure of the semiconductor laser light source system 201. As illustrated in FIG. 8, the semiconductor laser light source system 201 includes the (for example, three) semiconductor laser light source devices 110 horizontally arranged. Although FIG. 8 illustrates the structure in which each of the semiconductor laser light source devices 110 includes the cooler 2, the semiconductor elements 4 of the three semiconductor laser light source devices 110 may be placed on the one cooler 2.

Furthermore, the semiconductor laser light source system 201 may include the semiconductor laser light source devices 120 horizontally arranged instead of the semiconductor laser light source devices 110. Furthermore, although the image display apparatus 300 in FIG. 1 includes the three semiconductor laser light source devices 100, it may include the three semiconductor laser light source systems 201 instead.

Thus, in the semiconductor laser light source devices 110 and 120 according to Embodiment 2, the semiconductor laser is the semiconductor element 4 in which the chips 11 are arranged on the respective heat dissipation blocks 13, and the cooler 2 is placed directly below the heat dissipation blocks 13 to be in contact with the semiconductor elements 4. Thus, since the number of the terminal pins 15 can be reduced more than that according to Embodiment 1, the contact area between the cooler 2 and the semiconductor elements 4 can be increased, and the semiconductor elements 4 can be more efficiently cooled.

Accordingly, since the number of the terminal pins 15 can be reduced more than that according to Embodiment 1, the semiconductor laser light source devices 110 and 120 can be downsized.

Since the semiconductor laser light source system 201 includes the semiconductor laser light source devices 110 or 120, it can produce higher output than that by the semiconductor laser light source device 110 or 120 alone.

Furthermore, since the light source itself can be downsized, the image display apparatus 300 that is higher in reliability and smaller can be obtained.

Embodiment 3

Figure 9A:
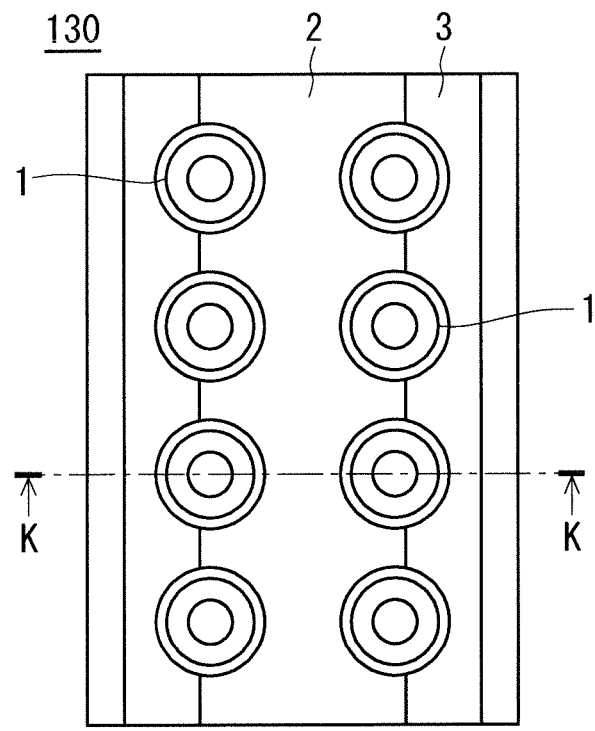
FIGS. 9A to 9C illustrate an outline structure of a semiconductor laser light source device according to Embodiment 3.
Figure 9B:
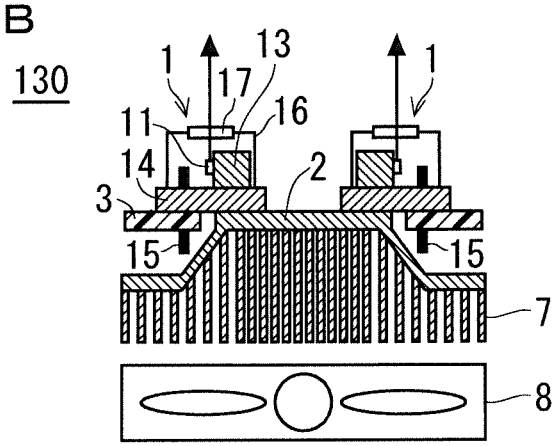
Figure 9C:
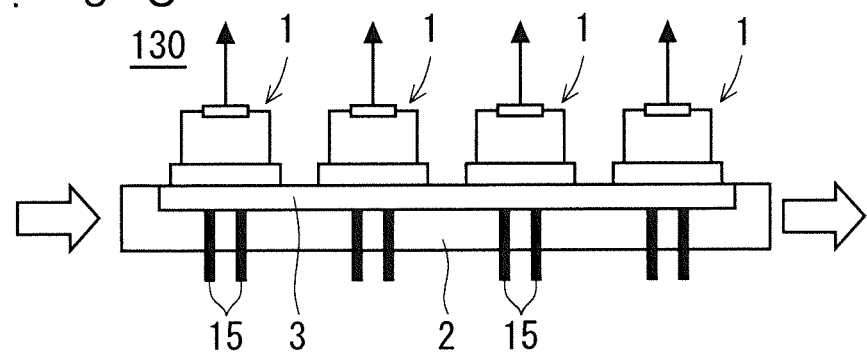

Next, a semiconductor laser light source device 130 according to Embodiment 3 will be described. FIGS. 9A to 9C illustrate an outline structure of the semiconductor laser light source device 130 according to Embodiment 3. Specifically, FIG. 9A is a plan view of the semiconductor laser light source device 130, FIG. 9B is a cross-sectional view taken along the line K-K of FIG. 9A, and FIG. 9C is a side view of the semiconductor laser light source device 130. The same reference numerals as those according to Embodiments 1 and 2 will be assigned to the same constituent elements and the description thereof will be omitted in Embodiment 3.

Although the driving substrate 3 is placed in contact with the lower surface of the cooler 2 (surface that is opposite to the surface of the cooler 2 on which the semiconductor lasers 1 are arranged) in Embodiment 1, each of the cooler 2 and the driving substrate 3 is placed in contact with the surface of the semiconductor laser 1 that is opposite to the light emitting surface thereof in Embodiment 3.

As illustrated in FIGS. 9A to 9C, the semiconductor lasers 1 are arranged in two lines so that the heat dissipation blocks 13 are facing to each other. The cooler 2 is formed in a protruding shape so that its center in the width direction is higher than the ends and that the upper surface at the center in the width direction is placed in contact with inner portions of the lower surfaces of the plates 14 of the semiconductor lasers 1. The driving substrate 3 is divided into two which are placed in contact with respective outside portions of the lower surfaces of the plates 14. The pair of the driving substrates 3 is placed above both ends of the cooler 2 in the width direction, and is not in contact with the cooler 2. The terminal pins 15 are arranged to protrude downward from pairs of the driving substrates 3. In other words, the terminal pins 15 are arranged at both ends of the semiconductor laser light source device 130 in the width direction, and the cooler 2 is arranged between the terminal pins 15 arranged at both ends of the semiconductor laser light source device 130 in the width direction.

The cooler 2 in Embodiment 3 differs from that in Embodiment 1 in that it include neither the hollow 2a nor the through holes 2b and the fins 7 are arranged on the lower surface of the cooler 2. Furthermore, a fan 8 is placed on the back of the fins 7.

Figure 10A:
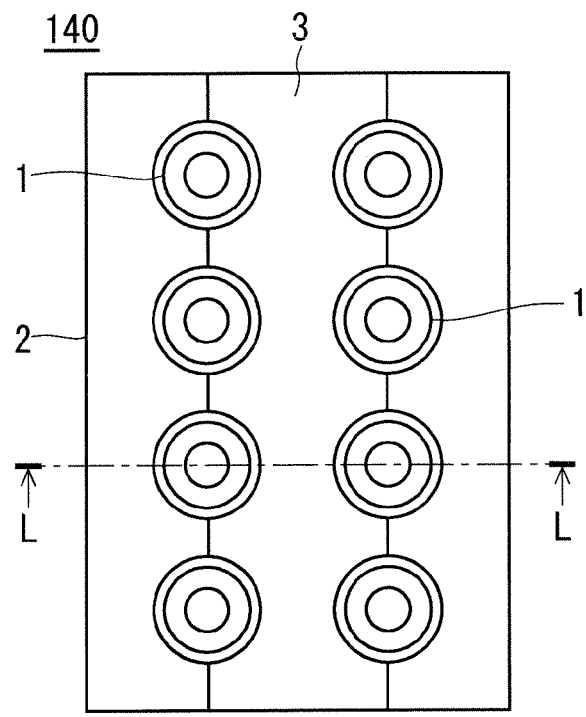
FIGS. 10A to 10C illustrate another outline structure of the semiconductor laser light source device according to Embodiment 3.
Figure 10B:
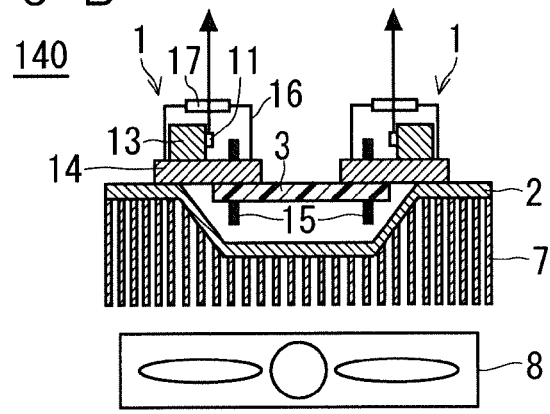
Figure 10C:
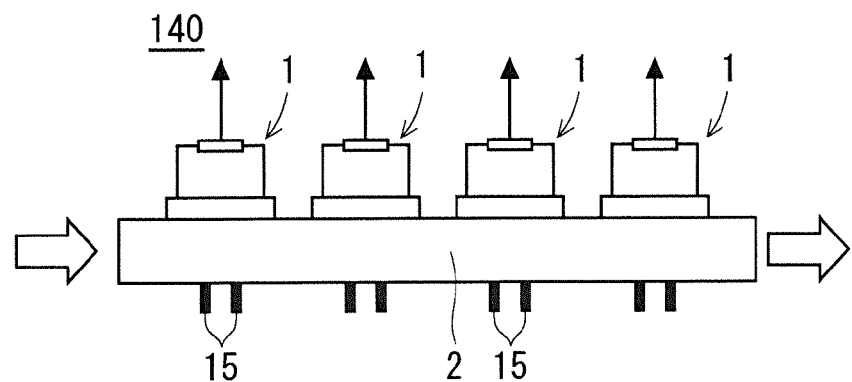

Next, another outline structure of the semiconductor laser light source device according to Embodiment 3 will be described. FIGS. 10A to 10C illustrate another outline structure of the semiconductor laser light source device according to Embodiment 3. Specifically, FIG. 10A is a plan view of a semiconductor laser light source device 140, FIG. 10B is a cross-sectional view taken along L-L of FIG. 10A, and FIG. 10C is a side view of the semiconductor laser light source device 140.

As illustrated in FIGS. 10A to 10C, the semiconductor lasers 1 are arranged in two lines so that the chips 11 including the light emitting layer 12 are facing to each other. The terminal pins 15 are arranged at the center of the semiconductor laser light source device 140 in the width direction. The driving substrate 3 is placed at the center of the semiconductor laser light source device 140 in the width direction, and both ends of the upper surface of the driving substrate 3 in the width direction are placed in contact with inner portions of the lower surfaces of the plates 14 of the semiconductor lasers 1. The cooler 2 is formed in a depressed shape so that its center in the width direction is lower than the ends and that both ends of the upper surface in the width direction are placed in contact with respective outside portions of the lower surfaces of the plates 14 of the semiconductor lasers 1.

Figure 11A:
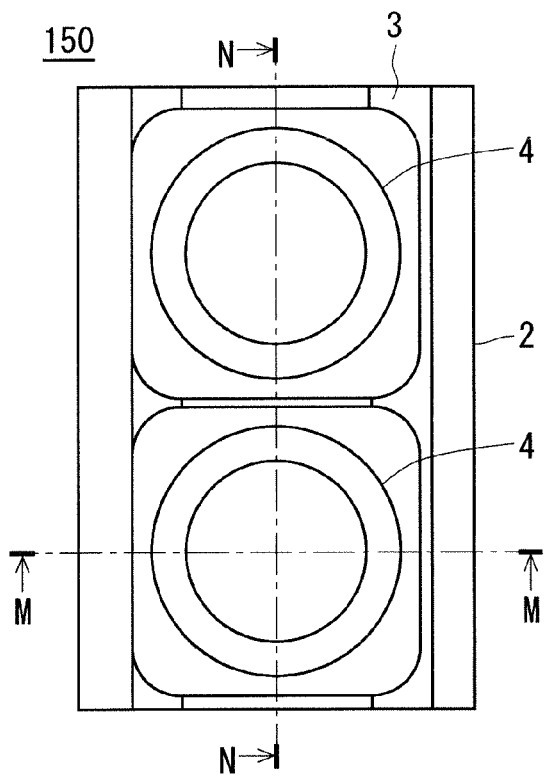
FIGS. 11A to 11C illustrate another outline structure of the semiconductor laser light source device according to Embodiment 3.
Figure 11B:
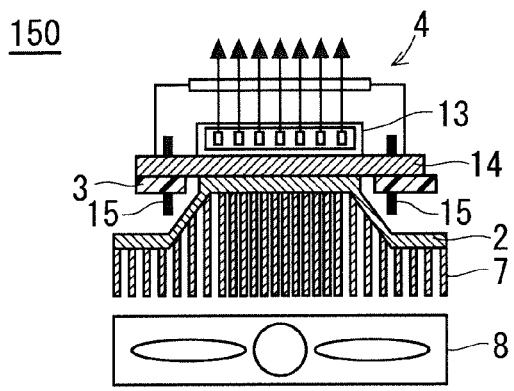
Figure 11C:
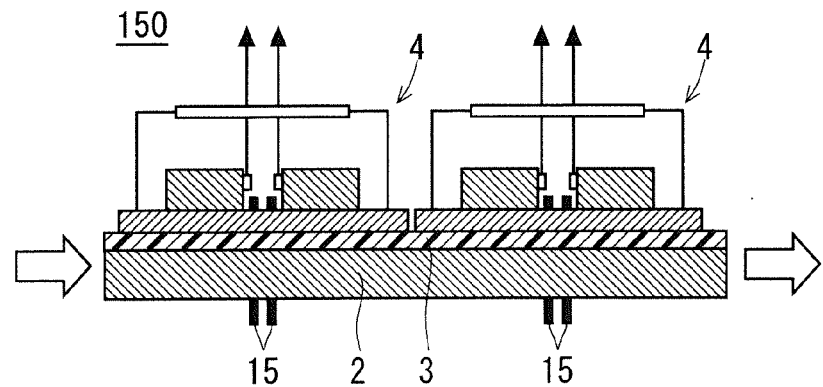

Next, two outline structures with the semiconductor elements 4 as the other outline structures of the semiconductor laser light source device according to Embodiment 3 will be described. FIGS. 11A to 11C illustrate another outline structure of the semiconductor laser light source device according to Embodiment 3. Specifically, FIG. 11A is a plan view of a semiconductor laser light source device 150, FIG. 11B is a cross-sectional view taken along M-M of FIG. 11A, and FIG. 11C is a cross-sectional view taken along N-N of FIG. 11A.

As illustrated in FIGS. 11A to 11C, the semiconductor laser light source device 150 includes the semiconductor elements 4 each including the terminal pins 15 placed outside of the heat dissipation block 13, and the cooler 2 between the terminal pins 15. In other words, the semiconductor laser light source device 150 is an example obtained by arranging the semiconductor elements 4 instead of the semiconductor lasers 1 in the semiconductor laser light source device 130 illustrated in FIGS. 9A to 9C.

Specifically, the cooler 2 is formed in a protruding shape so that its center in the width direction is higher than the ends and that the upper surface at the center in the width direction is placed in contact with the center portions of the lower surfaces of the plates 14 of the semiconductor elements 4. The driving substrate 3 is divided into two which are placed in contact with respective ends of the lower surfaces of the plates 14. The pair of the driving substrates 3 is placed above both ends of the cooler 2 in the width direction, and is not in contact with the cooler 2.

Figure 12A:
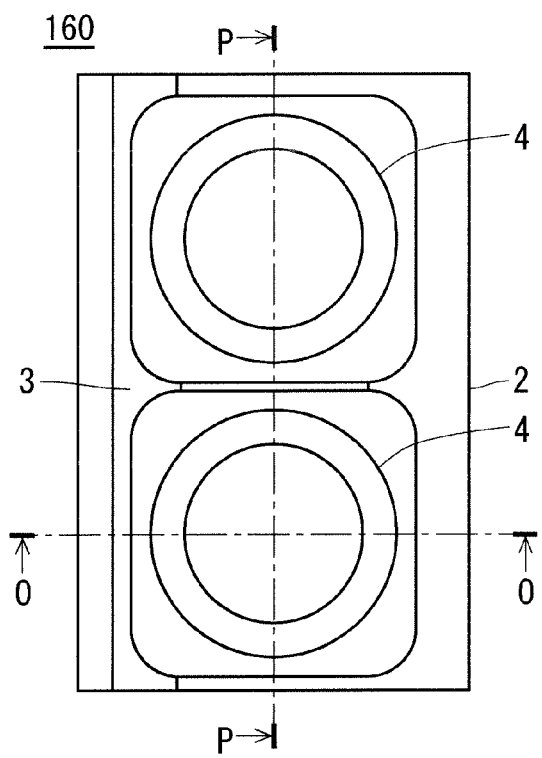
FIGS. 12A to 12C illustrate another outline structure of the semiconductor laser light source device according to Embodiment 3.
Figure 12B:
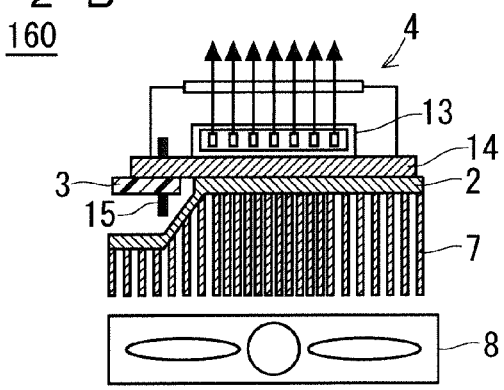
Figure 12C:
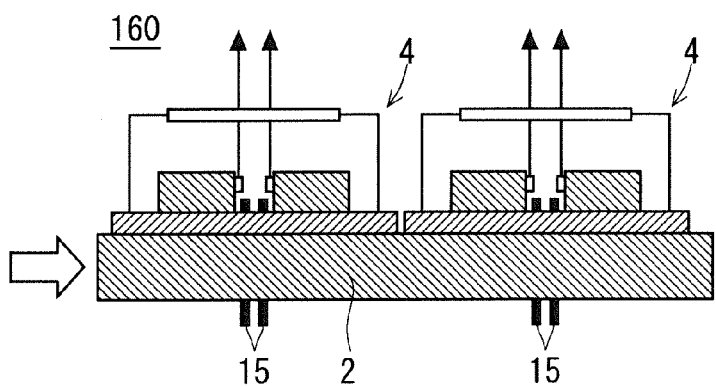

Next, the other outline structure will be described. FIGS. 12A to 12C illustrate the other outline structure of the semiconductor laser light source device according to Embodiment 3. Specifically, FIG. 12A is a plan view of a semiconductor laser light source device 160, FIG. 12B is a cross-sectional view taken along O-O of FIG. 12A, and FIG. 12C is a cross-sectional view taken along P-P of FIG. 12A.

As illustrated in FIGS. 12A to 12C, the semiconductor laser light source device 160 includes the semiconductor elements 4 each including the terminal pin 15 placed at one of the outside portions of the heat dissipation block 13, the cooler 2 directly below the heat dissipation block 13, and the driving substrate 3 outside of the terminal pin 15.

Specifically, the cooler 2 is formed in a shape such that its center in the width direction and one of the ends are higher than the other end and that the upper surface of the center portion in the width direction and the one end is placed in contact with the lower surface of the center portion and one of the ends of each of the plates 14 of the semiconductor elements 4. The driving substrate 3 is placed in contact with the lower surface of the other end of each of the plates 14. The driving substrate 3 is placed above the other end of the cooler 2 in the width direction, and is not in contact with the cooler 2.

As described above, in the semiconductor laser light source devices 130, 140, 150, and 160 according to Embodiment 3, each of the cooler 2 and the driving substrate 3 is placed in contact with the surfaces opposite to the light emitting surfaces of the semiconductor lasers 1 or the semiconductor elements 4. Thus, since the cooler 2 is in direct contact with the semiconductor lasers 1 or the semiconductor elements 4, the thermal resistance between the cooler 2 and the semiconductor lasers 1 or the semiconductor elements 4 can be reduced, and the semiconductor lasers 1 or the semiconductor elements 4 can be efficiently cooled.

Since the fins 7 of the cooler 2 can be increased in height according to Embodiment 3, the heat dissipation area can be increased and the performance of the cooler 2 can be improved. Furthermore, since the fins 7 are arranged outside of the cooler 2, a forced-air cooler including the fan 8 placed on the back of the fins 7 can be structured. Although Embodiment 3 describes the forced-air cooler 2 including the fan 8, the liquid cooling device as according to Embodiments 1 and 2 can be placed instead of the forced-air cooler 2.

Furthermore, the semiconductor laser light source devices according to Embodiment 3 can be used in a semiconductor laser light source system and an image display apparatus, similarly as Embodiments 1 and 2.

Although this invention has been described in detail, the description is in all aspects illustrative and does not restrict the invention. Therefore, numerous modifications that have yet been exemplified will be devised without departing from the scope of this invention.

Embodiments can be freely combined, and each of Embodiments can be appropriately modified or omitted within the scope of the invention.

DESCRIPTION OF REFERENCE NUMERALS 1 semiconductor laser, 2 cooler, 3 driving substrate, 4 semiconductor element, 100, 110, 120, 130, 140, 150, 160 semiconductor laser light source device, 200, 201 semiconductor laser light source system, 300 image display apparatus.

The invention claimed is:

1. A semiconductor laser light source device, comprising:
a semiconductor laser;
a cooler that cools said semiconductor laser; and
a driving substrate that drives said semiconductor laser,
wherein said cooler is placed in contact with a surface of said semiconductor laser, said surface being opposite to a light emitting surface of said semiconductor laser,
said driving substrate is placed in contact with a surface of said cooler, said surface being opposite to a surface of said cooler on which said semiconductor laser is placed, and
said cooler includes a hollow in which a plurality of fins are arranged.

2. The semiconductor laser light source device according to claim 1,
wherein said semiconductor laser is a semiconductor element including a heat dissipation block on which a plurality of chips are arranged, and
said cooler is placed directly below said heat dissipation block to be in contact with said semiconductor element.

3. A semiconductor laser light source device, comprising:
a semiconductor laser;
a cooler that cools said semiconductor laser; and
a driving substrate that drives said semiconductor laser,
wherein each of said cooler and said driving substrate is placed in contact with a surface of said semiconductor laser, said surface being opposite to a light emitting surface of said semiconductor laser,
said cooler is formed in a protruding shape so that a center of said cooler in a width direction is higher than ends of said cooler, or is formed in a depressed shape so that said center of said cooler in said width direction is lower than said ends of said cooler, and
a plurality of fins are arranged on a lower surface of said cooler.

4. A semiconductor laser light source system, comprising:
a plurality of said semiconductor laser light source devices according to claim 1.

5. A semiconductor laser light source system, comprising:
a plurality of said semiconductor laser light source devices according to claim 3.

6. An image display apparatus, comprising
said semiconductor laser light source device according to claim 1.

7. An image display apparatus, comprising
said semiconductor laser light source device according to claim 3.
8. An image display apparatus, comprising
said semiconductor laser light source system according to claim 4.
9. An image display apparatus, comprising
said semiconductor laser light source system according to claim 5.

* * * * *